(12) United States Patent
Lee et al.

(10) Patent No.: US 8,962,222 B2
(45) Date of Patent: Feb. 24, 2015

(54) PHOTOMASK AND METHOD FOR FORMING THE SAME

(75) Inventors: Hsin-Chang Lee, Hsin-Chu Xian (TW); Pei-Cheng Hsu, Taipei (TW); Chia-Jen Chen, Jhudong Township, Hsinchu County (TW); Anthony Yen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 79 days.

(21) Appl. No.: 13/495,291

(22) Filed: Jun. 13, 2012

(65) Prior Publication Data

US 2013/0337370 A1    Dec. 19, 2013

(51) Int. Cl.
*G03F 1/00*  (2012.01)
*G03F 1/44*  (2012.01)
*G03F 1/24*  (2012.01)
*G03F 1/68*  (2012.01)
*G03F 1/76*  (2012.01)

(52) U.S. Cl.
CPC .. *G03F 1/44* (2013.01); *G03F 1/24* (2013.01); *G03F 1/68* (2013.01); *G03F 1/76* (2013.01)
USPC .......................................................... 430/5

(58) Field of Classification Search
CPC ............... G03F 1/00; G03F 1/22; G03F 1/24; G03F 1/38; G03F 1/42; G03F 1/44
USPC ............................................................... 430/5
See application file for complete search history.

(56) References Cited

U.S. PATENT DOCUMENTS

| | | | |
|---|---|---|---|
| 2005/0196680 A1* | 9/2005 | Bouche et al. | 430/5 |
| 2009/0233188 A1* | 9/2009 | Amano et al. | 430/5 |
| 2011/0117479 A1* | 5/2011 | Suga et al. | 430/5 |
| 2012/0019916 A1* | 1/2012 | Shoki | 359/586 |
| 2013/0029253 A1* | 1/2013 | Mangat et al. | 430/5 |

OTHER PUBLICATIONS

Unpublished U.S. Appl. No. 13/464,116, filed May 4, 2012 entitled, "Intraoverlay Metrology", 27 pages.

* cited by examiner

*Primary Examiner* — Stewart Fraser
(74) *Attorney, Agent, or Firm* — Haynes and Boone, LLP

(57) ABSTRACT

A photomask having a machine-readable identifying mark and suitable for manufacturing integrated circuit devices and a method for forming the photomask and identifying mark are disclosed. An exemplary embodiment includes receiving a design layout corresponding to a pattern to be formed on a photomask blank. A specification of an identifying code is also received along with the photomask blank, which includes a substrate, a reflective layer, and an absorptive layer. A first patterning is performed using the design layout. A second patterning is performed using the specification of the identifying code.

20 Claims, 7 Drawing Sheets

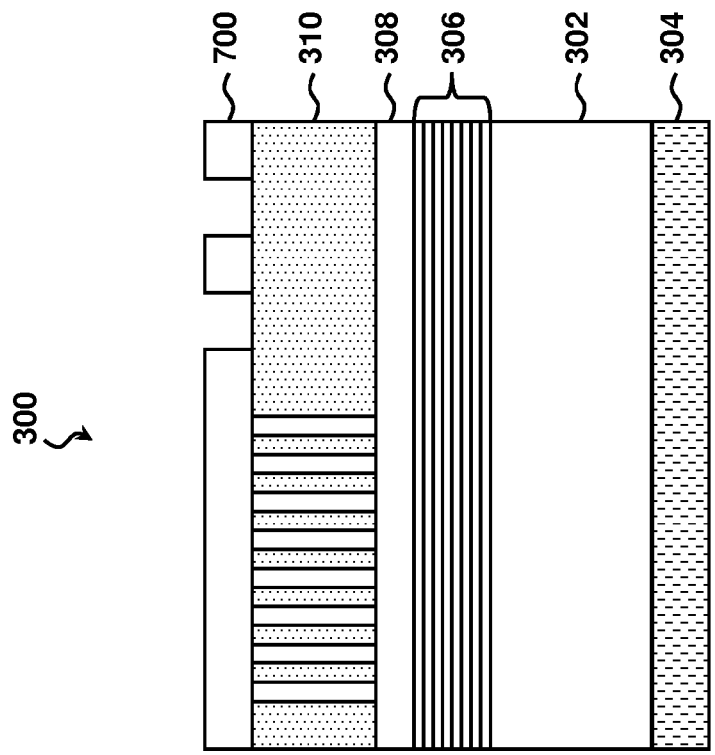
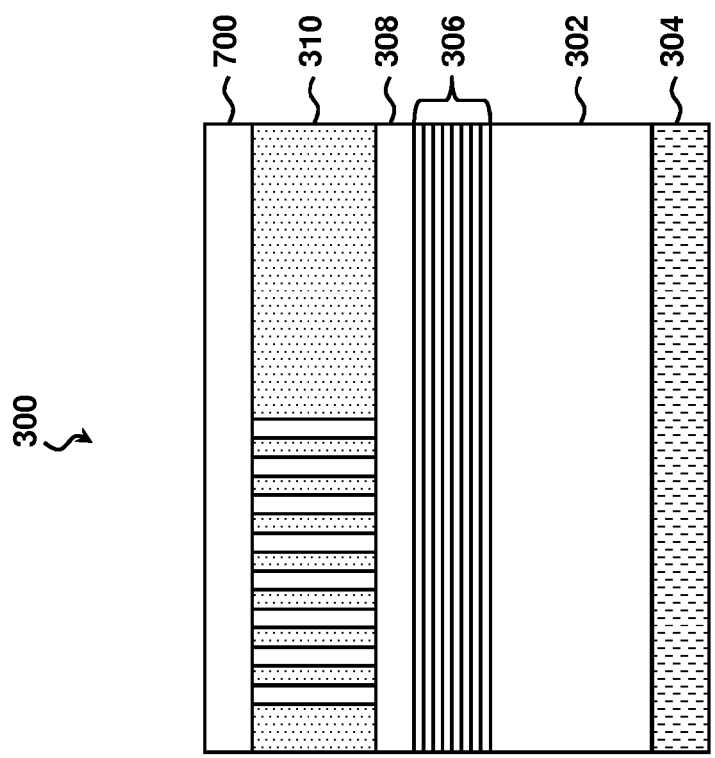

PHOTOMASK AND METHOD FOR FORMING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, traditional transmissive photolithography has been supplemented or replaced with reflective photolithography. ICs are typically assembled by layering features on a semiconductor substrate using a set of photolithographic masks. Transmissive masks have patterns formed by transmissive regions. During photolithographic exposure, radiation such as ultraviolet light passes through the mask before striking a photoresist coating on the substrate. The mask transfers the pattern onto the photoresist. In contrast, a reflective mask includes reflective and non-reflective regions. During exposure, the light reflected off the mask is used to form the pattern on the substrate. After either type of exposure, the photoresist is selectively removed to reveal the pattern. The substrate then undergoes processing steps that take advantage of the shape of the remaining photoresist to create circuit features on the substrate. When the processing steps are complete, photoresist is reapplied and substrate is exposed using the next mask. In this way, the features are layered to produce the final circuit.

One technique for reducing feature size involves the use of high frequency radiation such as extreme ultraviolet. However, complications arise as frequency increases. For example, many mask materials do not transmit extreme ultraviolet radiation. For this and other reasons, a reflective mask may present advantages over a transmissive mask. Reflective photolithography has delivered positive results but presents challenges as well.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-10 are sectional views of a mask undergoing a method of mask making according to aspects of the present disclosure.

DETAILED DESCRIPTION

Figure 1A:
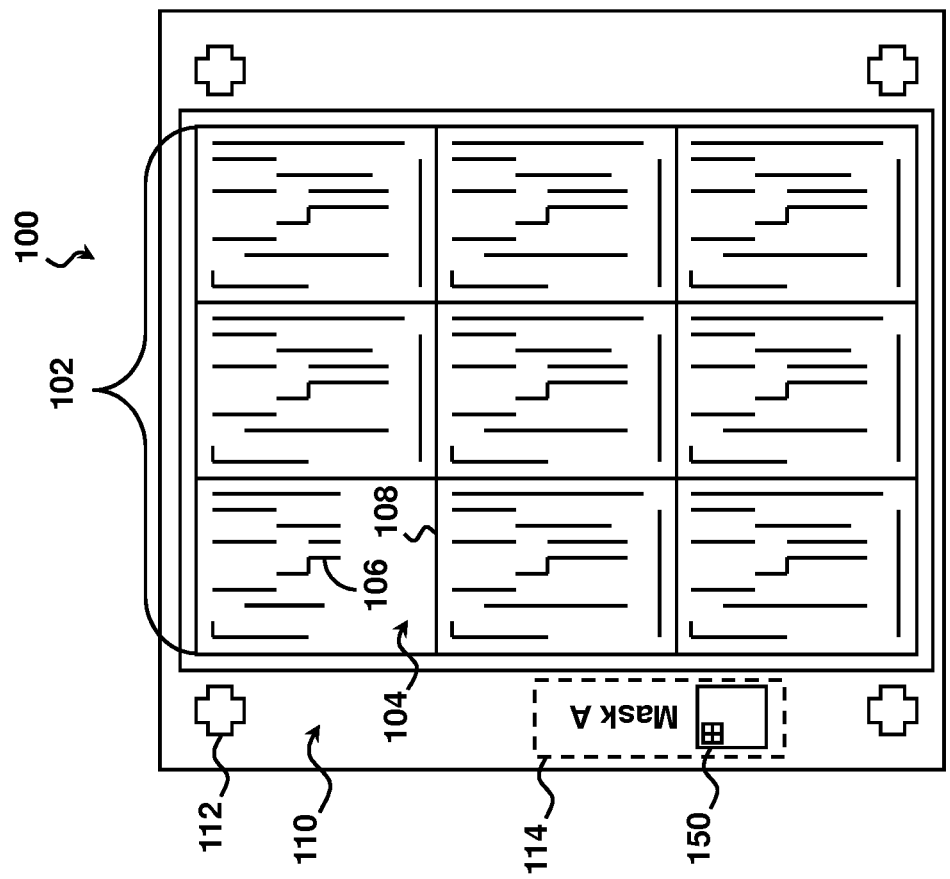
FIG. 1a is a diagrammatic illustration of a design layout corresponding to a mask for IC manufacturing according to various aspects of the present disclosure.

The present disclosure relates generally to reflective masks for IC device manufacturing and, more particularly, to a method of forming a mask identifier on a reflective mask for IC manufacturing and to the mask having the mask identifier.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations), and the spatially relative descriptors used herein may likewise be interpreted accordingly.

FIG. 1a is a diagrammatic illustration of a design layout 100 corresponding to a mask for IC manufacturing according to various aspects of the present disclosure. In an embodiment, the design layout 100 is a computer model and contains a representation of a mask in a predetermined design standard such as GDSII, or OASIS. The design layout 100 contains a die area 102, which contains one or more dies 104 containing device features 106. The dies 104 may be separated by scribe lines 108, sacrificial areas intended to be used when dicing the wafer. The design layout 100 includes a frame area 110 around the die area 102, which contains the fiducial features, markings that are not part of an integrated circuit but are nonetheless a part of IC production. These fiducial features can include alignment marks 112 and a mask identifier 114 along with other features such as logos and text. The mask identifier 114 is used to distinguish the mask throughout the manufacturing process. For example, the mask identifier 114 may be used to identify and distinguish the mask during mask manufacture, mask inspection, and exposure processes, as well as during mask transport and storage and other manufacturing steps. As such, the mask identifier may contain any information relevant to identifying the mask and may present it in any suitable format such as plain text and machine-readable identifying codes in addition to combinations thereof. The design layout 100 may contain all or part of the mask identifier 114 and/or may contain a reserved area for the mask identifier 114. In an embodiment, the design layout contains a reserved area for the mask identifier 114 and part of the specification of the mask identifier 114 is provided separately. In a further embodiment, the design layout contains a reserved area for the mask identifier 114, and all of the specification of the mask identifier 114 is provided separately. This allows the manufacture of multiple masks, each having a unique mask identifier 114, from a single design layout 100. In the illustrated embodiment, the mask identifier 114 includes a machine-readable identifying code 150 configured to be read by a scanning tool.

Figure 1B:
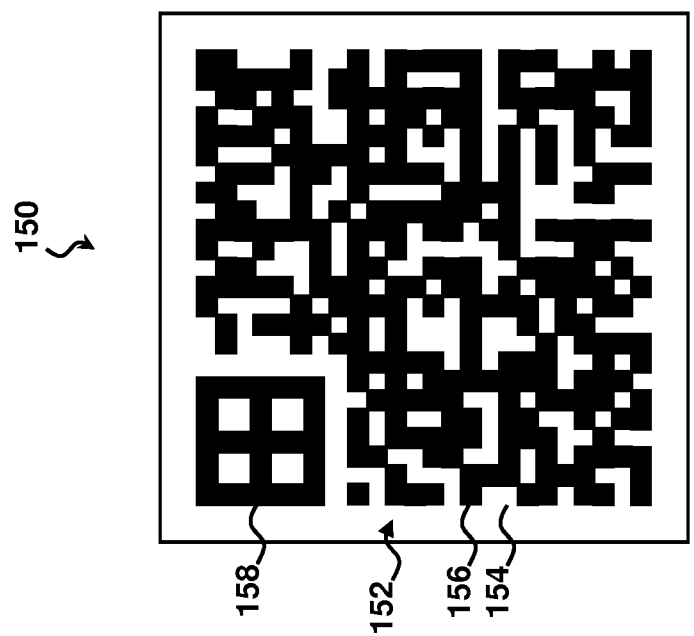
FIG. 1b is a diagrammatic top view of a machine-readable identifying code according to various aspects of the present disclosure.

FIG. 1b is a diagrammatic top view of a machine-readable identifying code 150 according to various aspects of the present disclosure. The machine-readable identifying code 150 may include a data region 152. In an embodiment, the data region 152 includes high-intensity features 154 and low-intensity features 156. In the illustrated embodiment, the high-intensity features 154 and low-intensity features 156 represent binary data. The binary data may correspond to an identification of the mask (e.g., a serial number, a mask name, a mask type, a mask attribute, or other suitable identifier) and/or other characteristics of the mask such as a suitable process characteristic or a performance metric. The machine-readable identifying code 150 may also include a reference mark 158 such as a position, alignment, or timing mark. In various embodiments, the machine-readable identifying code 150 complies with a linear code standard (1d barcode) or matrix code standard (2d barcode) such as UPCA, QR Code® (a trademark of Denso Wave Inc.), Data Matrix, and/or PDF417.

In order for the scanning tool to read a machine-readable identifying code 150, the tool must be able to recognize a contrast between high-intensity features 154 and low-intensity features 156 when scanned at a particular wavelength. For example, a scanning tool may require at least a 14% contrast ratio between high-intensity features 154 and low-intensity features 156. However, mask materials commonly fail to meet the scanning requirements. Mask materials selected for their optical properties at an actinic frequency (a frequency used during exposure), or an inspection frequency may exhibit different optical properties at the frequency used by the scanning tool. For example, a mask may be configured for optimal lithographic performance in a 13.5 nm wavelength environment and/or for optimal inspection performance in a 193 nm wavelength environment. In the same example, the scanning tool may utilize 470 nm visible light. A mask configuration optimized for 13.5 nm extreme ultraviolet radiation may not exhibit the necessary optical properties when scanned using 470 nm visible light. One solution is to form alternate mask profiles for circuit features such as device feature 106 and identifying marks such as identifying code 150.

Figure 2:
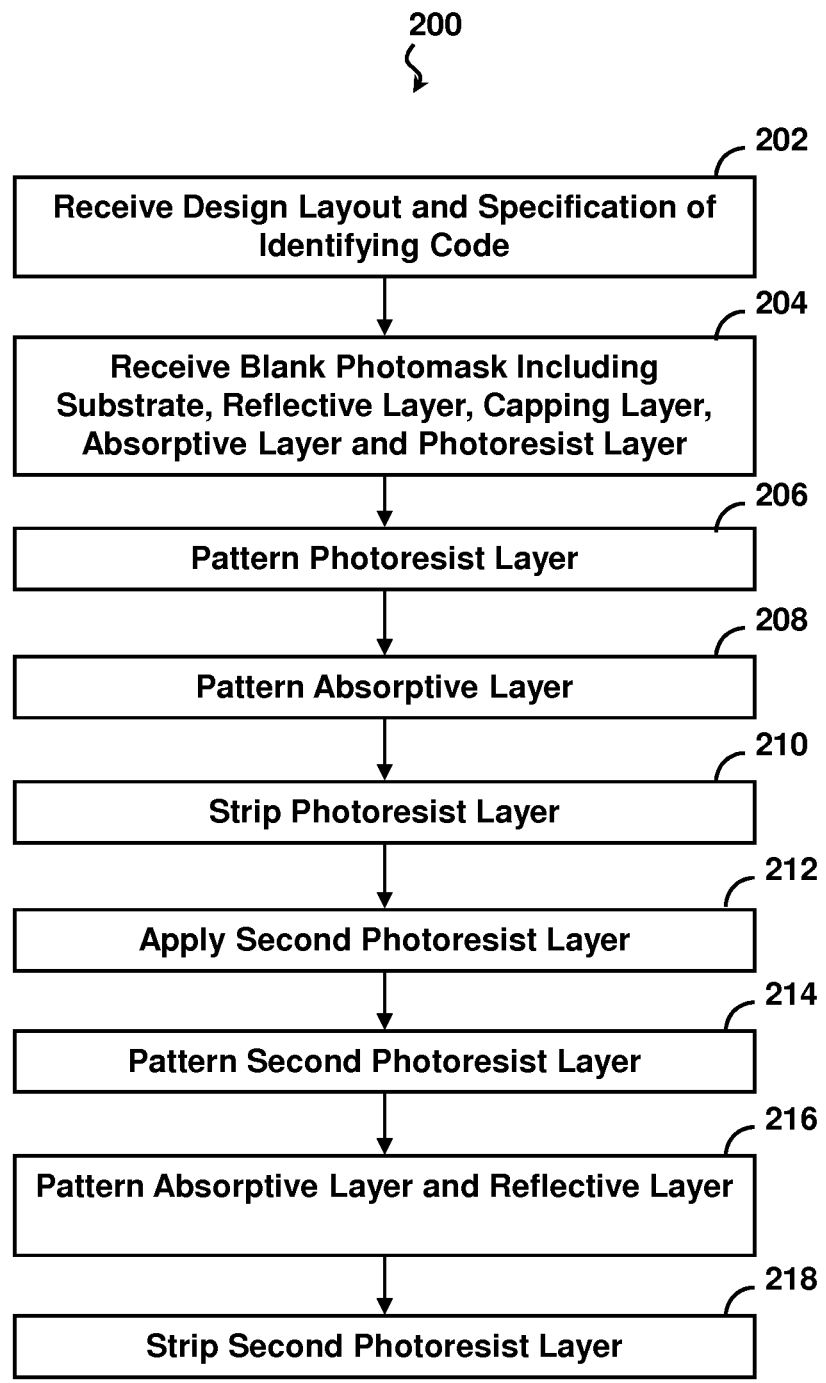
FIG. 2 is a flow diagram of a method of mask making according to aspects of the present disclosure.

A method 200 of mask making is described with reference made to FIGS. 2-10. The method is suitable for producing masks with machine-readable identifying codes 150 having an improved contrast ratio. FIG. 2 is a flow diagram of the method 200 of mask making according to aspects of the present disclosure. It is understood that additional steps can be provided before, during, and after the method 200, and some of the steps described can be replaced or eliminated for other embodiments of the method. FIGS. 3-10 are sectional views of a photolithographic mask 300 (also referred to as a photomask or, just simply, a mask) undergoing the method 200 of mask making according to aspects of the present disclosure.

Figure 3:
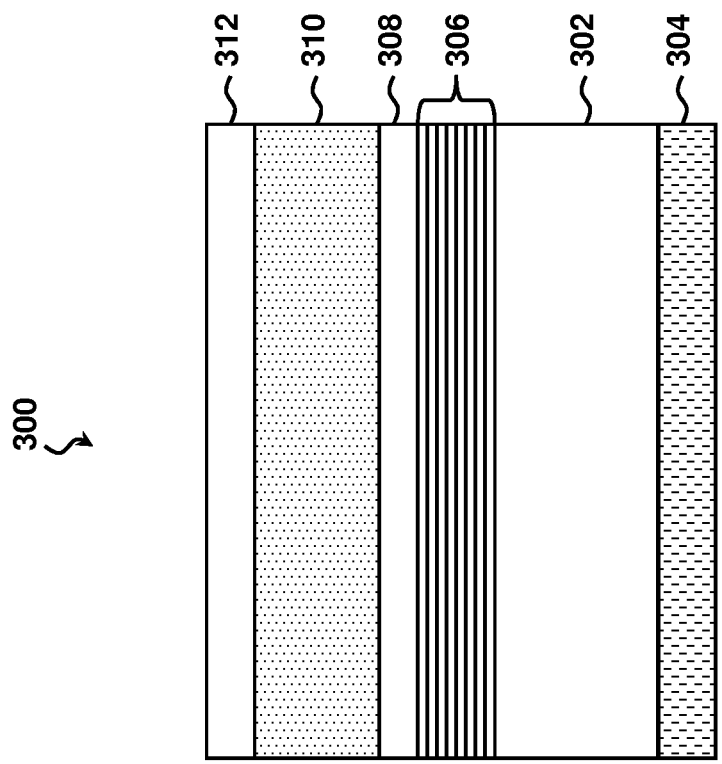

Referring first to FIG. 2, in block 202, a design layout 100 corresponding to a pattern to be formed on a mask and a specification of a machine-readable identifying code 150 is received. The design layout 100 may include one or more device features 106 disposed within a die area 102. The design layout 100 may contain part or all of the specification of the machine-readable identifying code 150. Alternately, the specification of the machine-readable identifying code 150 may be entirely separate from the design layout 100. Referring further to FIG. 3, in block 204, a mask 300 is received for patterning. At this stage, because the mask 300 has not undergone a patterning process, the mask 300 may be referred to as a blank mask. The mask 300 includes photomask substrate 302. The substrate 302 commonly includes a low thermal expansion material (LTEM). Exemplary low thermal expansion materials include quartz as well as LTEM glass, silicon, silicon carbide, silicon oxide, titanium oxide, Black Diamond® (a trademark of Applied Materials), and/or other low thermal expansion substances known in the art. To support the photomask substrate 302, a chucking layer 304 such as an electrostatic chucking layer or a mechanical chuck may be attached to the photomask substrate 302. Exemplary electrostatic chucking layer 304 materials include chromium nitride, chromium oxynitride, chromium, TaBN, and TaSi.

A reflective layer 306 is disposed over the photomask substrate 302. The reflective layer 306 may include a multilayer mirror (MLM). An MLM comprises a number of alternating material layers. Typical numbers of alternating pairs range from 20 to 80, however reflective layer 306 may include any number of pairs. The materials used for each alternating pair are selected based on a refractive index. The pairs are then configured to provide the desired reflectivity for particular characteristics of light such as wavelength and/or angle of incidence. For example, a thickness or material may be tailored to achieve maximum constructive interference of extreme ultraviolet radiation reflected at each interface of the film pairs while achieving a minimum absorption of extreme ultraviolet radiation by the reflective layer 306. An exemplary MLM includes forty pairs of alternating molybdenum and silicon (Mo—Si) layers. A further exemplary MLM includes alternating molybdenum and beryllium (Mo—Be) layers. A capping layer 308 (also known as a buffer layer) may be disposed over the reflective layer 306. In an embodiment, the capping layer 308 protects the reflective layer 306 during an etching and/or repair process. The capping layer may include materials such as Ru, silicon dioxide, and/or amorphous carbon.

An absorptive layer 310 is disposed on the capping layer 308. The absorptive layer 310 may comprise TaN, TaBN, TiN, chromium, combinations thereof, and/or other suitable absorptive materials. In some embodiments, the absorptive layer 310 contains multiple layers of absorptive material, for example a layer of chromium and a layer of tantalum nitride. The absorptive layer 310 may be any suitable thickness for a given material to achieve an adequate absorption. The absorptive layer 310 may also include an anti-reflective coating (ARC). Suitable ARC materials include such as TaBO, $Cr_2O_3$, $SiO_2$, SiN, $TaO_5$, TaON, and/or other suitable materials. In an embodiment, the mask 300 also includes a photoresist layer 312 disposed on the absorptive layer 310. In an embodiment, the photoresist layer 312 is a laser beam resist. The photoresist layer may be formed by any suitable method such as spin-on coating.

The layers 306, 308, 310, and 312 may be formed on the substrate 302 by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, and/or other methods known in the art. In an embodiment, the absorptive layer 310 is deposited by a sputtering deposition technique to achieve a controlled thickness and uniformity with relatively low defects and good adhesion. The compositions and/or physical structures of one or more layers described above may be selected based upon reflectivity/absorption of the radiation to be used with the mask 300, the stress compatibility with adjacent layers, and/or other criteria known in the art.

Figure 4:
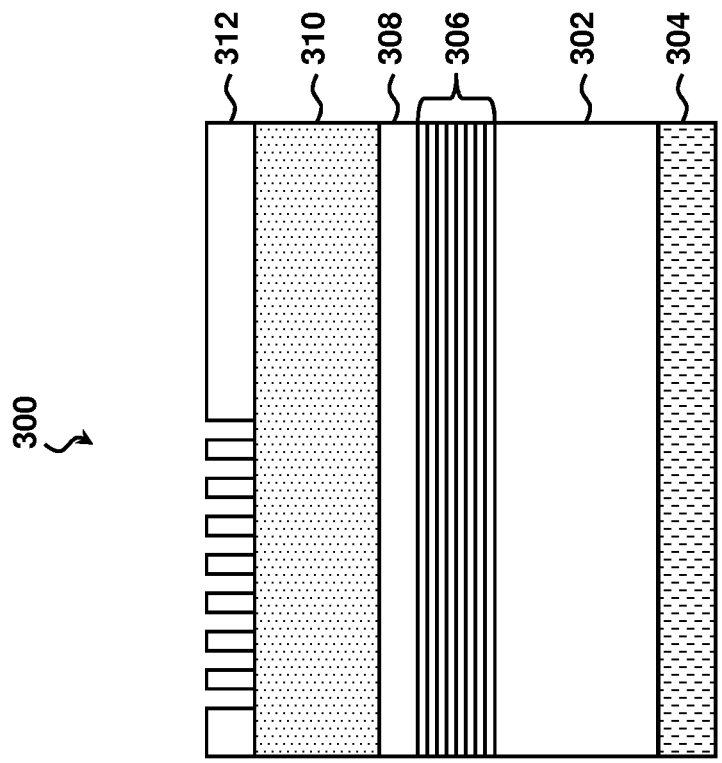

Referring to block 206 and FIG. 4, in embodiments where the mask 300 includes a photoresist layer 312, the photoresist layer 312 is patterned based on the received design layout 100. In the illustrated embodiment, patterning omits shapes corresponding to the machine-readable readable identifying code 150. Instead, the photoresist layer 312 is patterned based on the remaining features within the design layout 100 including device features 106. One advantage of omitting the identifying code 150 is reduced patterning time. A machine-readable identifying code 150 is often large relative to a die 104 and may have a much larger critical dimension than a device feature 106. Therefore, for example, for methods of patterning that are sensitive to the number or size of shapes created, omitting shapes corresponding to the machine-readable identifying code 150 may reduce the time required to pattern the photoresist layer 312.

Commonly, the photoresist layer 312 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer 312 may include soft baking, mask aligning, exposure, post-exposure baking, developing the photoresist, rinsing, drying (e.g., hard baking), other suitable processes, and/or combinations thereof.

Figure 5:
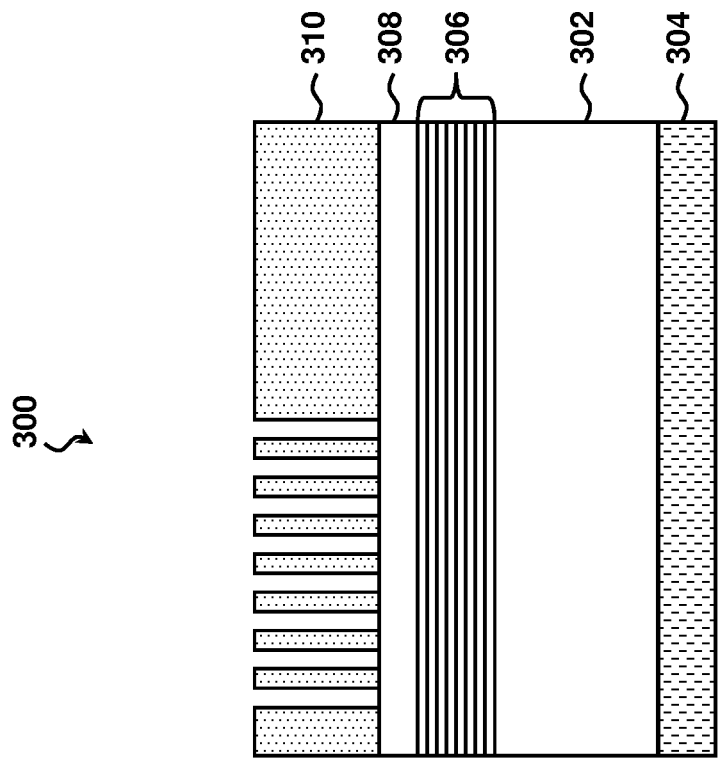
Figure 6:
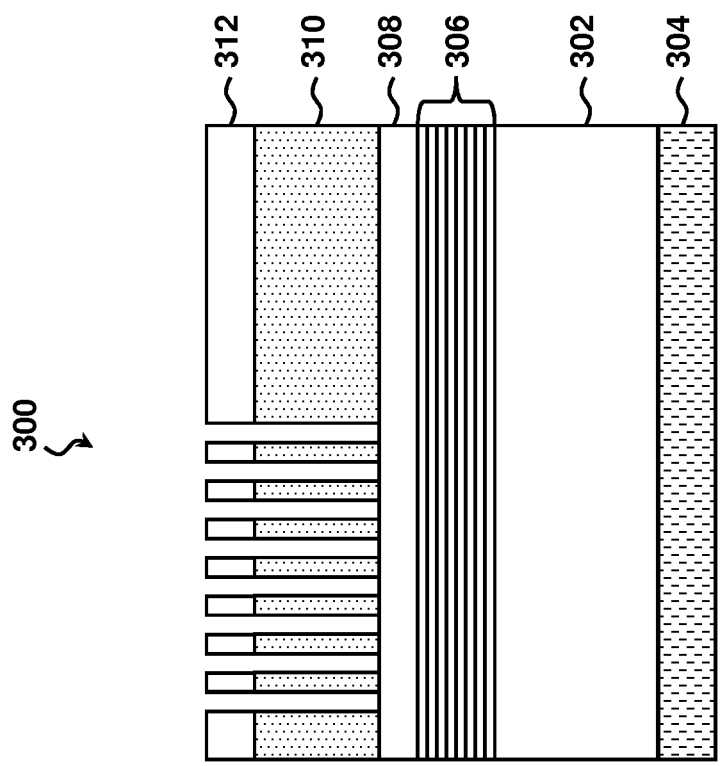
Figure 10:
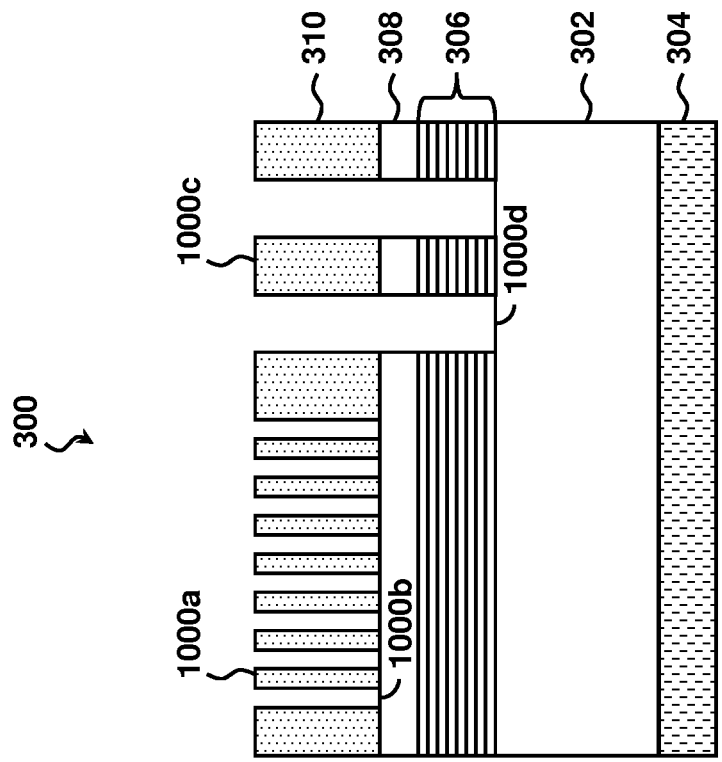

In block 208 and FIG. 5, the absorptive layer 310 is patterned. In an embodiment where the mask 300 includes a photoresist layer 312, the absorptive layer 310 is patterned using the photoresist layer 312. This process may be referred to as a pattern transfer. In further embodiments, the absorptive layer 310 is patterned directly. In an embodiment, the absorptive layer 310 is patterned based on features within the design layout 100 including device features 106. However, in this embodiment, the absorptive layer 310 is not patterned with shapes corresponding to the machine-readable identifying code 150. In an embodiment, patterning the absorptive layer 310 includes one or more etching processes to selectively remove portions of the absorptive layer 310 and to uncover portions of the reflective layer 306. The etching processes may include dry etching, wet etching, and/or other etching methods. In block 210 and FIG. 6, the photoresist layer 312 is stripped from the mask 300.

In block 212 and FIG. 7, a second photoresist layer 700 is applied to the mask 300. The second photoresist layer 312 may be a positive-type resist or a negative-type resist. The second photoresist layer 700 may be an e-beam resist. In block 214 and FIG. 8, the second photoresist layer 700 is patterned based on the specification of the machine-readable identifying code 150. In various embodiments, the second photoresist layer 700 is patterned with shapes corresponding to high-intensity features 154, low-intensity features 156, and/or reference marks 158.

Patterning the second photoresist layer 700 may involve modifying the specification of the machine-readable identifying code 150. For example, the specification of the identifying code 150 may be inverted to account for the different responses of the absorptive layer 310. In a typical mask-making process, the absorptive layer 310 is etched in order to expose the reflective layer 306. This has the effect of creating a "bright" reflective area associated the etched region. Thus, a typical mask-making process may associate a "bright" feature with an etched region, and a "dark" feature with an unetched region. However, at the frequency used to read an identifying code 150, the absorptive layer 310 may reflect sufficient radiation to be utilized as a reflective area. Thus in some embodiments, the method associates a "bright" feature with an unetched region, and a "dark" feature with an etched region. In one such embodiment where the specification of the machine-readable identifying code 150 does not account for this different behavior, the specification is inverted. This ensures that the photoresist 700 and eventually the absorptive layer 310 and reflective layer 306 are removed in regions where a low-intensity reflection is desired.

The second photoresist layer 700 may be patterned using any suitable method including electron beam (e-beam) writing, ion-beam writing, photolithography, and/or maskless photolithography. Patterning the second photoresist layer 700 may further include soft baking, mask aligning, exposure, post-exposure baking, developing the photoresist, rinsing, drying (e.g., hard baking), other suitable processes, and/or combinations thereof. In an embodiment, the identifying code 150 has a relatively large feature size and large critical dimension compared to a device feature 106. This allows the use, in such embodiments, of more affordable, higher-speed, more efficient, and more fault tolerant patterning methods. In an embodiment, patterning the photoresist layer 700 includes a laser exposure and subsequent photoresist developing.

Figure 9:
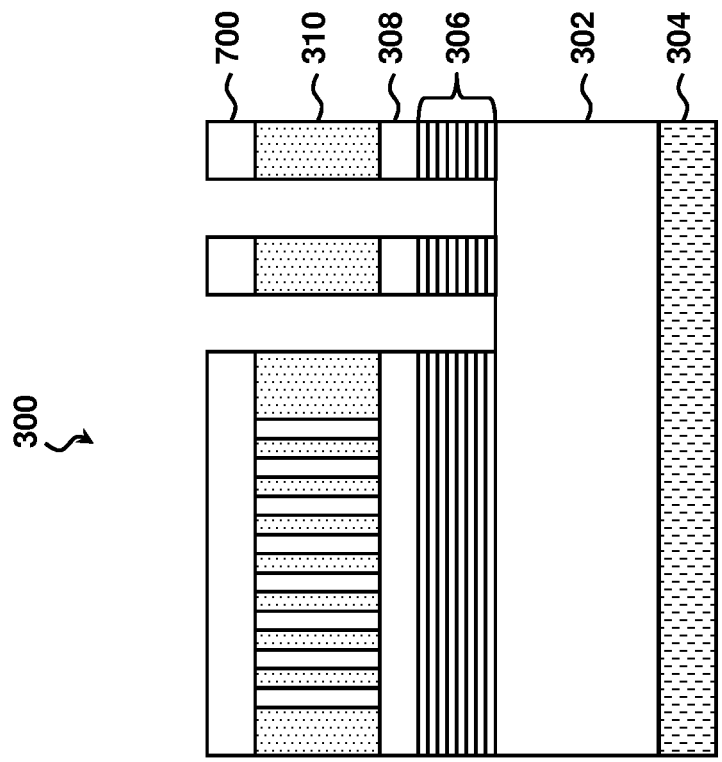

Referring to block 216 and FIG. 9, the absorptive layer 310, the capping layer 308, and the reflective layer 306 are patterned based on the specification of the machine-readable identifying code 150. In an embodiment, the absorptive layer 310, the capping layer 308, and the reflective layer 306 are patterned using the second photoresist layer 700. This process may be referred to as a pattern transfer. In further embodiments, the layers are patterned directly. The absorptive layer 310, the capping layer 308, and the reflective layer 306 may be patterned via a multistep etching process or a single step etching process. In an exemplary single step etching process, a dry etching is performed using fluorine-containing gas chemistry such as $CF_4$, $SF_6$, $NF_3$, and/or any other suitable gas. Referring to block 218 and FIG. 10, the remaining second photoresist layer 700 is stripped.

Figure 11:
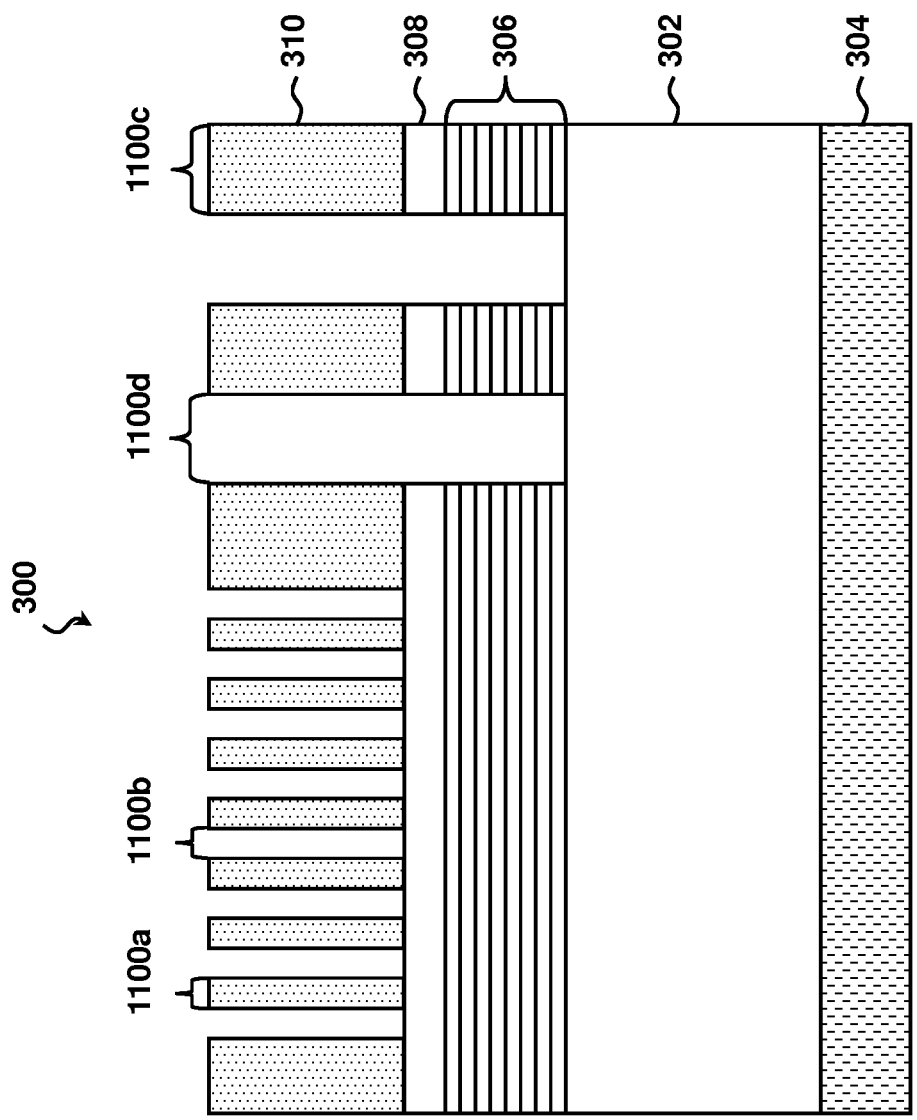
FIG. 11 is a sectional view of a mask having an enhanced contrast identifying mark according to aspects of the present disclosure.

Forming independent mask profiles for circuit features and for mask identifiers such as machine-readable identifying code 150 allows the manufacturer to adjust each profile for its intended optical environment. Thus, one advantage is that mask shapes corresponding to circuit features may be formed to provide optimal contrast at an actinic frequency, and mask shapes corresponding to mask identifiers may be formed to provide optimal contrast at a scanning frequency. FIG. 11 is a sectional view of a mask having an enhanced contrast identifying mark according to aspects of the present disclosure. In an embodiment, radiation of a first type, for example extreme ultraviolet radiation, directed at mask region 1100a corresponding to a device feature is absorbed by the absorptive layer 310 instead of being transmitted. Conversely, radiation of the first type directed at mask region 1100b, corresponding to another device feature is transmitted through the absorptive layer 310. This radiation is then reflected by the reflective layer 306 within mask region 1100b.

Continuing in this embodiment, absorptive layer 310 prevents transmission of radiation of a second type, for example visible light used by a scanning tool. Thus, radiation of the second type directed at mask region 1100c corresponding to a mask identifying feature is reflected and/or absorbed by the absorptive layer 310. However, if the reflective layer 306 has similar optical properties in response to radiation of the second type, light reflected from the reflective layer 306 may not provide sufficient contrast with light reflected from the absorptive layer 310. In mask region 1100d, the profile is configured to allow radiation of the second type to be transmitted through the absorptive layer 310 and the reflective layer 306 to deeper structures of the mask 300 such as the photomask substrate 302. The materials of these deeper structures including the photomask substrate 302 may exhibit greater contrast with the absorptive layer 310. Thus, this mask profile may provide a greater contrast between mask region 1100c and 1100d in response to radiation of the second type.

Another advantage to forming independent mask profiles for circuit features and for mask identifiers is that it may prove faster and more economical. As mentioned, a mask identifier typically has a much larger critical dimension than a circuit feature. Many patterning processes used to form photomasks are slow and expensive. For example, e-beam patterning a large area such as a mask identifier may prove time-consuming, and the e-beam device may offer a degree of accuracy and precision that is neither required nor utilized. Performing a second patterning with a less demanding, less precise, and potentially much less expensive method may justify the added process steps.

The present disclosure presents multiple embodiments and multiple advantages. It is understood that the attribution of an advantage to an embodiment is merely for clarity and understanding. Different embodiments can offer different advantages, and no particular advantage is required for any one embodiment.

Thus, the present disclosure provides methods for forming a photolithography mask with an enhanced contrast identification mark and further provides the mask containing the identification mark. In an exemplary method for manufacturing the photomask, the method comprises receiving a design layout corresponding to a pattern to be formed on a photomask blank; receiving a specification of an identifying code; receiving the photomask blank including a substrate, a reflective layer, and an absorptive layer; performing a first patterning using the design layout; and performing a second patterning using the specification of the identifying code. In an example, performing the first patterning includes performing a first patterning of the absorptive layer and performing the second patterning includes performing a second patterning of the absorptive layer and patterning the reflective layer. The first patterning of the absorptive layer may include configuring the absorptive layer to transmit radiation through a first region of the absorptive layer. The performing of the second patterning of the absorptive layer may include configuring the absorptive layer to transmit radiation through a second region of the absorptive layer corresponding to the identifying code. The patterning of the reflective layer may include configuring the reflective layer to transmit radiation through a region of the reflective layer corresponding to the identifying code. In an example where the design layout includes the specification of the identifying code, performing the first patterning excludes the identifying code from the first patterning. In an example, the method further includes modifying the specification of the identifying code by replacing a feature of a first type with a feature of a second type, and performs the second patterning using the modified specification. Performing the first patterning may include patterning a first photoresist layer and transferring the pattern to the absorptive layer, and performing the second patterning may include patterning a second photoresist layer and transferring the pattern to the absorptive layer and the reflective layer.

An exemplary method for manufacturing a photomask comprises: receiving a design layout containing a device feature to be formed on a photomask blank; receiving a specification of an identifying code; receiving the photomask blank including a substrate, a reflective layer, an absorptive layer, and a first photoresist layer; patterning the first photoresist layer based on the device feature of the design layout; etching the absorptive layer using the patterned first photoresist layer; applying a second photoresist layer; patterning the second photoresist layer based on the specification of the identifying code; etching the absorptive layer and the photoresist layer using the patterned second photoresist layer.

An exemplary method for utilizing a photomask with an enhanced contrast identifying mark comprises: receiving a photomask having a first feature with a first depth and a second feature with a second depth, wherein the first depth and the second depth are different; identifying the photomask utilizing the first feature; and exposing a photoresist layer of a substrate utilizing the second feature. In an example, identifying the photomask includes exposing the photomask to a light source having a first wavelength, and exposing the photoresist layer includes performing a photolithographic process with a light source having a second wavelength different from the first. The first depth may be configured to provide a contrast at the first wavelength, and the second depth may be configured to provide a contrast at the second wavelength. An exemplary first wavelength is 470 nm. In an example, identifying the photomask includes: exposing the photomask to a light source to produce an image of an identifying code, interpreting binary data from the image of the identifying code, and determining one or more of: a serial number, a mask name, a mask type, and a mask attribute from the binary data.

An exemplary photomask having an enhanced contrast identifying mark comprises: a substrate; a reflective layer disposed on the substrate; and an absorptive layer disposed on the reflective layer; wherein the photomask contains: a device feature region having a first recess defined therein, the first recess having a first depth; and an identifying code feature region having a second recess defined therein, the second recess having a second depth different from the first depth. In an example, the first depth is configured to transmit radiation having a first wavelength through the absorptive layer, and the second depth is configured to transmit radiation having a second wavelength through the absorptive layer and the reflective layer. The absorptive layer may be configured to absorb radiation having the first wavelength directed incident to the device feature region, and the reflective layer may be configured to reflect radiation having the first wavelength and directed incident to the device feature region. In an example, the photomask further includes a capping layer configured to transmit radiation having the first wavelength and directed incident to the device feature region. The substrate may be an LTEM substrate. In an example, the identifying code feature region corresponds to a machine-readable identifying code. The machine-readable identifying code may include a data region and a reference mark.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photomask for integrated circuit manufacturing comprising:
a substrate;
a chucking layer disposed on a first surface of the substrate;
a reflective layer disposed on a second surface of the substrate, wherein the second surface is opposite the first surface; and
an absorptive layer disposed on the reflective layer;
wherein the photomask contains:
a device feature region having a first recess defined therein, the first recess having a first depth; and
an identifying code feature region having a second recess defined therein, the second recess having a second depth different from the first depth, wherein the second recess is configured to transmit radiation through the reflective layer, and wherein the chucking layer extends underneath the second recess.

2. The photomask of claim 1,
wherein the first depth is configured to transmit radiation having a first wavelength through the absorptive layer; and
wherein the second depth is configured to transmit radiation having a second wavelength through the absorptive layer and the reflective layer.

3. The photomask of claim 2,
wherein the absorptive layer is configured to absorb radiation having the first wavelength and directed incident to the device feature region, and
wherein the reflective layer is configured to reflect radiation having the first wavelength and directed incident to the device feature region.

4. The photomask of claim 3, wherein the photomask further comprises a capping layer configured to transmit radiation having the first wavelength and directed incident to the device feature region.

5. The photomask of claim 1, wherein the substrate includes a low thermal expansion material (LTEM).

6. The photomask of claim 1, wherein the identifying code feature region corresponds to a machine-readable identifying code.

7. The photomask of claim 6, wherein the machine-readable identifying code includes a data region and a reference mark.

8. The photomask of claim 1, wherein the identifying code feature region represents a photomask identifier by an optical contrast between a portion of the reflective layer and a portion of the substrate underlying the second region.

9. A photomask comprising:
a photomask blank including a substrate, a chucking layer, a reflective layer, and an absorptive layer;
a first pattern on the photomask blank in the absorptive layer, wherein the first pattern includes a feature of a design layout; and
a second pattern in the absorptive layer and reflective layer, wherein the second pattern includes a feature of an identifying code, and wherein the chucking layer is disposed on the photomask blank opposite the second pattern.

10. The photomask of claim 9,
wherein the first pattern in the absorptive layer includes a recess in the absorptive layer that is configured to transmit radiation through a first region of the absorptive layer;
wherein the second pattern in the absorptive layer includes a recess in the absorptive layer that is configured to transmit radiation through a second region of the absorptive layer; and
wherein the second pattern in the reflective layer includes a recess in the reflective layer that is configured to transmit radiation through a region of the reflective layer.

11. The photomask of claim 10,
wherein the second region of the absorptive layer and the region of the reflective layer correspond to the feature of the identifying code.

12. The photomask of claim 9,
wherein the design layout includes a specification of the identifying code.

13. The photomask of claim 9,
wherein a specification of the identifying code includes a specification of a high-intensity feature;
wherein the second pattern includes a low-intensity feature substituted for the high-intensity feature.

14. The photomask of claim 9, wherein the second pattern represents the identifying code by a contrast between the absorptive layer and the substrate.

15. The photomask of claim 9, wherein the second pattern includes a data region.

16. A lithographic mask comprising:
a substrate;
a reflective structure formed on the substrate;
an absorptive structure formed on the reflective structure;
a chucking layer disposed on the substrate opposite the reflective structure; and
an identifying feature uniquely identifying the lithographic mask, the identifying feature including a first region that includes a recess in the reflective structure configured to transmit radiation through the reflective structure, wherein a portion of the chucking layer is disposed underneath the recess.

17. The lithographic mask of claim 16, wherein the identifying feature includes a barcode defined in part by the first region.

18. The lithographic mask of claim 16, wherein the identifying feature includes text defined in part by the first region.

19. The lithographic mask of claim 16, wherein the identifying feature is defined by an optical contrast between the absorptive structure and the first region.

20. The lithographic mask of claim 16, wherein the identifying feature is defined by an optical contrast between the absorptive structure and a portion of the substrate exposed by the first region.

* * * * *